United States Patent [19]

Fushiki

[11] Patent Number: 4,468,627
[45] Date of Patent: Aug. 28, 1984

[54] RIAA EQUALIZER CIRCUIT

[75] Inventor: Tatsuo Fushiki, Hamamatsu, Japan

[73] Assignee: Nippon Gakki Seizo Kabushiki Kaisha, Hamamatsu, Japan

[21] Appl. No.: 408,284

[22] Filed: Aug. 16, 1982

[30] Foreign Application Priority Data

Aug. 17, 1981 [JP] Japan ................................ 56-128334

[51] Int. Cl.³ ............................................ H03F 3/191
[52] U.S. Cl. ................................... 330/107; 330/294; 330/304; 333/28 R
[58] Field of Search ................. 330/97, 107, 109, 290, 330/294, 304; 333/28 R; 360/65

[56] References Cited

U.S. PATENT DOCUMENTS 4,105,945  8/1978  Sano et al. ......................... 330/294
4,117,412  9/1978  Holman ............................ 330/304 X Primary Examiner—James B. Mullins
Assistant Examiner—Steven T. Mottula
Attorney, Agent, or Firm—Cushman, Darby & Cushman

[57] ABSTRACT

An equalizer circuit is provided which has a high D.C. stability without degrading the equalization characteristic. The equalizer circuit comprises an equalizer amplifier, an equalizer element, a direct current component detecting circuit, and a negative feedback circuit. The equalizer amplifier amplifies an input signal of the equalizer circuit in accordance with RIAA equalization characteristic. The output of the equalizer amplifier is applied to the equalizer element which has an impedance corresponding to an inversed RIAA equalization characteristic. The output from the equalizer element, which is not subject to the RIAA equalization characteristic due to the provision of the equalizer element, is supplied to the direct current component detecting circuit in order to derive a direct current component from the output. The derived direct current component is negative fed-back to the equalizer amplifier as a negative feedback signal thereof.

10 Claims, 10 Drawing Figures

RIAA EQUALIZER CIRCUIT

BACKGROUND OF THE INVENTION (a) Field of the Invention

This invention relates to an equalizer circuit capable of having a high D.C. (direct current) stability without worsening the equalization characteristic.

(b) Description of the Prior Art

Shown in FIG. 1 is a known typical circuit arrangement of equalizer circuits of the type in which an improvement of D.C. stability for a D.C. drift or the like is incorporated. Such a conventional equalizer circuit as shown in FIG. 1 comprises an equalizer amplifier 3 and a D.C. feedback circuit 6. The equalizer amplifier 3 comprises an amplifier 2 which is applied with a negative feedback through an equalizer element 1 (for example, an impedance element whose impedance value Ze corresponds to an inversed RIAA equalization characteristic). The D.C. feedback circuit 6 comprises an integration circuit 4 for integrating the output of the equalizer amplifier 3, and an inverter amplifier 5 for amplifying inversely in phase the output of the integration circuit 4. The D.C. feedback circuit 6 operates to feedback a portion of the D.C. components of the output of the equalizer amplifer 3 to the input thereof.

In the equalizer circuit constructed as above, an input signal applied to an input terminal 7 is amplified in accordance with a RIAA equalization characteristic to be delivered at an output terminal 8. In addition, the D.C. stability of the equalizer circuit is improved due to the provision of the D.C. feedback circuit 6.

Thus constructed equalizer circuit, however, has been found not satisactory in a practical use where the equalizer circuit has a high gain such as one used for a moving-coil type phono-cartridge. Since the low frequency cut-off characteristic of the D.C. feedback circuit 6 is characterized in a slow attenuation rate of 6 dB/oct, a sufficient attenuation degree is not obtained over an extreme low frequency range when the equalizer circuit having a high gain is used. As a result, the D.C. output of the equalizer circuit is susceptible to a D.C. drifting.

In view of the above problem, there has been proposed to set the lower cut-off frequency at a high frequency (e.g., over 1 Hz) in order to ensure a sufficient attenuation degree over the extreme low requency range. This proposed solution, however, results in a new problem that both low frequency characteristics of the D.C. feedback circuit 6 and the equalizer amplifier 3 interfere with each other thus to cause an undesirable deviation of the equalizer circuit characteristic from an ideal one throughout a low frequency range. A typical deviation characteristic of the equalizer circuit is illustratively shown in FIG. 2 wherein a solid line A designates such a deviation curve, $f_L$ and $f_M$ representing a first pole frequency and a second pole frequency, respectively corresponding to the frequencies 50 Hz and 500 Hz according to an RIAA standard.

SUMMARY OF THE INVENTION

It is, therefore, a principal object of the present invention to provide a novel equalizer circuit with a high D.C. stability with respect to D.C. drift without degrading the equalization characteristic.

The equalizer circuit according to the invention has a high D.C. attenuation rate over an extreme low frequency range so that the D.C. stability of the equalizer circuit is extremely high and, moreover, the equalization characteristic of the circuit meets a RIAA equalization characteristic with negligible deviation therefrom.

In a preferred embodiment of the present invention which will be described hereinunder in detail, the equalizer circuit comprises: an input signal terminal for receiving an input signal; amplifying means coupled to the input signal terminal for amplifying in accordance with a RIAA equalization characteristic the input signal applied to the input signal terminal; an output signal terminal for outputting the amplified input signal; equalizer element means connected at its one end to the output signal terminal and having an impedance corresponding to an inversed RIAA equalization characteristic; direct current component detecting means connected to the other end of the equalizer element means for deriving direct current component from the output appearing at the other end; and negative feedback circuit means for negatively feeding back the derived direct current component to the amplifying means.

The foregoing and other objects, the features and the advantages of the present invention will be pointed out in, or apparent from, the following description of the preferred embodiments considered together with the accompanying drawings.

DETAILED DESCRIPTION OF THE PREFERRED EMBODIMENTS

The invention will now be described in more detail in conjunction with the accompanying drawings.

Figure 1:
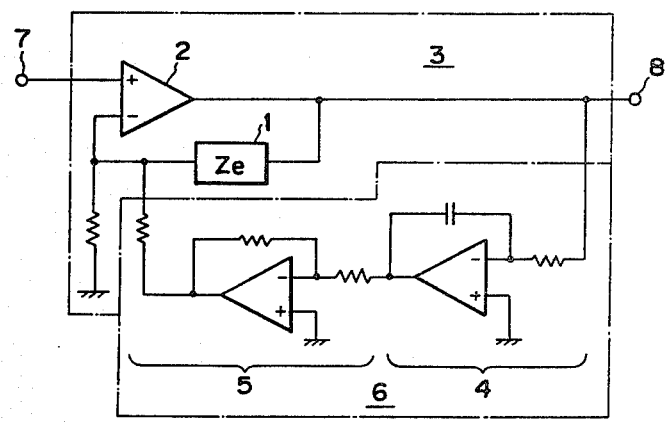
FIG. 1 is a schematic circuit diagram of a prior art typical equalizer circuit.
Figure 2:
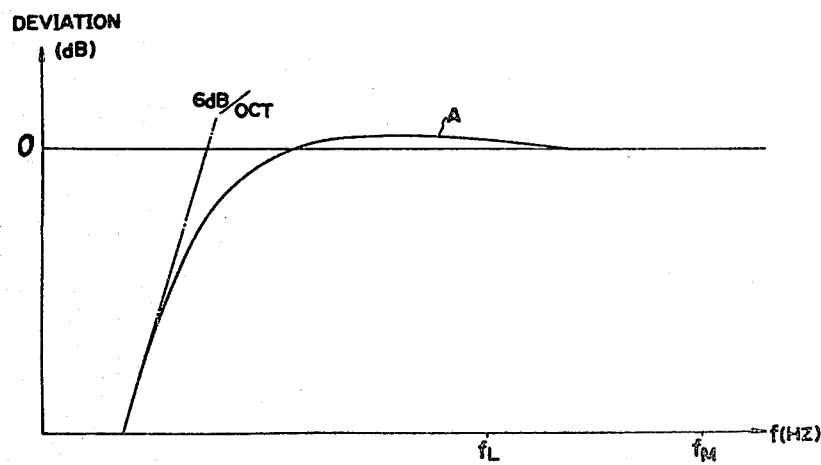
FIG. 2 is a graph showing a deviation of characteristic of the equalizer circuit shown in FIG. 1.
Figure 3:
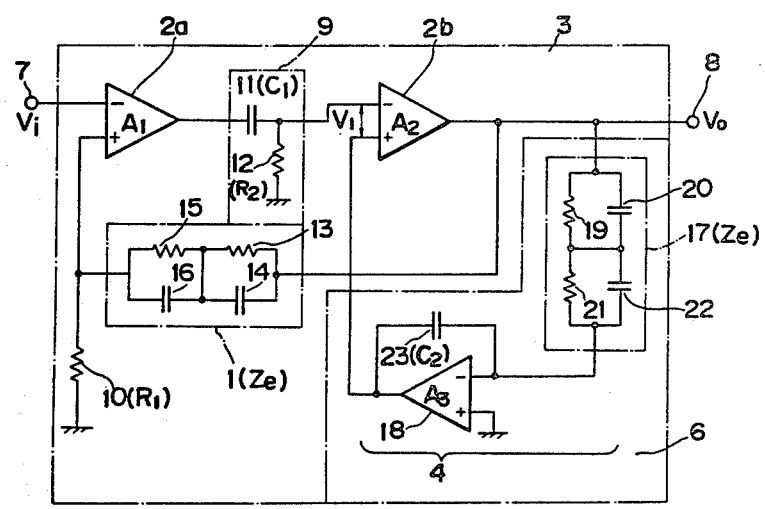
FIG. 3 is a schematic circuit diagram of a first embodiment of an equalizer circuit according to the present invention.

Referring now to FIG. 3, there is shown a circuit diagram illustrating an arrangement of a first embodiment of the equalizer circuit according to the present invention, wherein identical reference numerals have been used to designate corresponding parts of FIG. 1. In FIG. 3, the equalizer circuit is comprised of an equalizer amplifier generally designated at 3, and a D.C. feedback circuit 6. The equalizer amplifier 3 comprises an amplifier 2a with a gain $A_1$, an amplifier 2b with a gain $A_2$, coupling network 9 for the amplifier 2a and 2b, and an equalizer element 1 having an impedance Ze the impedance characteristic of which corresponds to an inverted RIAA equalization characteristic.

In the equalizer amplifier 3, an input terminal 7 of the equalizer circuit is connected to an inverting input terminal of the amplifier 2a whose non-inverting input terminal is grounded through a resistor 10 (resistance value R1). An output terminal of the amplifier 2a is connected through a capacitor 11 of the coupling network 9 (capacitance value C1) to an inverting input terminal of the amplifier 2b, which input terminal is grounded through a resistor 12 (resistance value R2) of the coupling network 9. An output terminal of the amplifier 2b is connected to an output terminal 8 of the equalizer circuit, and further to the non-inverting input terminal of the amplifier 2a through the equalizer element 1. The equalizer element 1 comprises a pair of parallel connected resistor 13 and capacitor 14, and a pair of parallel connected resistor 15 and capacitor 16, both pairs being connected serially to each other to constitute the equalizer element 1 as a whole.

The D.C. feedback circuit 6 comprises a Miller integration circuit 4 which includes an equalizer element 17 (impedance Ze) having the same circuit configuration as the equalizer element 1 described above.

In the D.C. feedback circuit 6, one terminal of the equalizer element 17 is connected to the output terminal of the amplifier 2b, and the other terminal is connected to an inverting input terminal of an amplfier 18 (gain A3) of the Miller integration circuit 4. The equalizer element 17 comprises, as similar to the equalizer element 1, a pair of parallel connected resistor 19 and capacitor 20, and a pair of parallel connected resistor 21 and capacitor 22, both pairs being connected serially to each other to constitute the equalizer element 17 as a whole. In the Miller integration circuit 4, a capacitor 23 (capacitance value C2) is coupled between the inverting input terminal and an output terminal of the amplifier 18, a non-inverting input terminal of the amplifier 18 being grounded, and the output terminal being connected to the non-inverting input terminal of the amplifier 2b.

The operation of the equalizer circuit thus constructed will be described hereinunder: An input signal applied to the input terminal 7 is amplified inversely in phase by the amplifier 2a, and then through the coupling network 9 is further amplified inversely in phase by the amplifier 2b to deliver an output signal at the output terminal 8. In this case, since a portion of the output of the amplifier 2b is negative-fed back to the input side of the amplifier 2a through the equalizer element 1, the equalizer amplifier 3 amplifies the input signal in accordance with the RIAA equalization characteristic thereby to generate at the output terminal 8 the output signal having the RIAA equalization characteristic. While in the D.C. feedback circuit 6, a D.C. component of the output signal of the amplifier 2b is derived therefrom by the Miller integration circuit 4 whose integration circuit element are composed of the equalizer element 17 and the capacitor 23. The D.C. component is then fed back to the input side of the amplifer 2b to make an improvement in the D.C. stability. It is appreciated here that the RIAA equalization characteristic is fully removed from the signal applied to the inverting input terminal of the amplfier 18, because, in order to cancel out the RIAA equalization characteristic, the output signal of the amplfier 2b having the RIAA equalization characteristic is passed through the equalizer element 17 having an impedance corresponding to an inversed RIAA equalization characteristic (i.e., which impedance decreases gradually in the order of low, middle and high frequency ranges). As a result, a negative feedback signal generated by the D.C. feedback circuit 6 is not dependent upon and hence does not interfere with the RIAA equalization characteristic of the equalizer amplifer 3.

The frequency characteristic of the equalizer circuit of the above embodiment will be discussed by using mathematical analysis. First, assuming that the voltage of the input signal applied to the input terminal 7 is represented by Vi, the voltage between the inverting and non-inverting input terminals of the amplifier 2b is represented by $V_1$, and the voltage of the output signal appearing at the output terminal 8 of the equalizer circuit is represented by $V_0$, then the equalizer circuit of FIG. 3 may be shown in a simplified form by a block diagram of FIG. 4. In the block diagram shown in FIG. 4, a summing point 24 and a block 25 correspond to a circuit portion comprised of the amplifier 2a and coupling network 9, a summing point 26 and a block 27 correspond to the amplifier 2b, a block 28 corresponds to the equalizer element 1 and resistor 10, and a block 6 corresponds to the D.C. feedback circuit 6.

Figure 4:
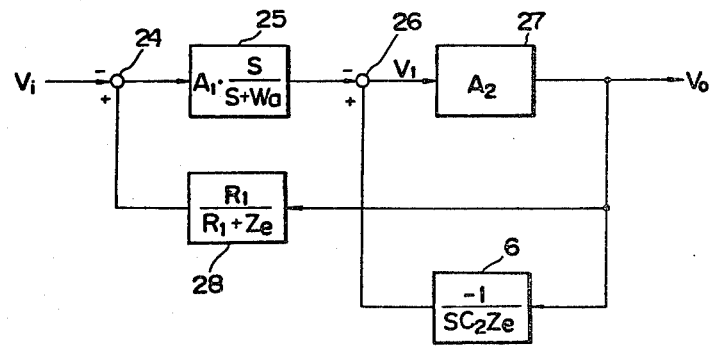
FIG. 4 is a block diagram illustrating an operational principle of the equalizer circuit shown in FIG. 3.

In FIG. 4, the voltages Vi, $V_1$ and Vo are related to one another in the following equations (1) and (2)

$$v_0 = A_2 \cdot v_1 \tag{1}$$

$$v_1 = -\left(v_0 \cdot \frac{R_1}{R_1 + Ze} - v_i\right) \cdot A_1 \cdot \frac{S}{S + \omega a} - \frac{v_0}{SC_2 Ze} \tag{2}$$

where $$\omega a = \frac{1}{C_1 R_2},$$

and $A_3 \gg 1$. Accordingly, the relation between the voltages Vi and Vo is written as $$v_0 = -\left(v_0 \cdot \frac{R_1}{R_1 + Ze} - v_i\right) \cdot A_1 A_2 \cdot \frac{S}{S + \omega a} - A_2 \cdot \frac{v_0}{SC_2 Ze} \tag{3}$$

$$\left(1 + A_1 A_2 \cdot \frac{R_1}{R_1 + Ze} \cdot \frac{S}{S + \omega a} + \frac{A_2}{SC_2 Ze}\right) v_0 =$$

$$A_1 A_2 \cdot \frac{S}{S + \omega a} \cdot v_i$$

Therefore, the voltage gain Gv of the equalizer circuit is given in the following, assuming that $A_1 \cdot A_2 \gg 1$ $$Gv = \frac{v_0}{v_i} \tag{4}$$

$$= \frac{A_1 A_2 \cdot \frac{S}{S + \omega a}}{1 + A_1 A_2 \cdot \frac{R_1}{R_1 + Ze} \cdot \frac{S}{S + \omega a} + \frac{A_2}{SC_2 Ze}}$$

$$= \frac{1}{\frac{S + \omega a}{S A_1 A_2} + \frac{R_1}{R_1 + Ze} + \frac{S + \omega a}{S^2 A_1 C_2 Ze}}$$

-continued
$$= \frac{1}{\frac{R_1}{R_1 + Ze} + \frac{S + \omega a}{S^2 A_1 C_2 Ze}}$$

The above equation (4) is written in the form of $$Gv = \frac{1 + \frac{Ze}{R_1}}{1 + \frac{(R_1 + Ze)}{R_1} \cdot \frac{(S + \omega a)}{S^2 A_1 C_2 Ze}} \quad (5)$$

In the equation (5), the second term of the denominator can be neglected over the low, middle and high frequency ranges so that it is seen from the equation that the voltage gain Gv of the equalizer circuit varies in accordance with the impedance Ze, i.e., follows the RIAA equalization characteristic.

Furthermore, in the equation (5), the value $(R_1 + Ze)$ in the second term of the denominator can be considered to be nearly equal to Ze over the extreme low frequency range, the equation (5) is written as $$Gv = \frac{1 + \frac{Ze}{R_1}}{1 + \frac{S + \omega a}{S^2 A_1 C_2 R_1}} \quad (6)$$

$$= \frac{\left(1 + \frac{Ze}{R_1}\right) \cdot S^2}{S^2 + \frac{S}{A_1 C_2 R_1} + \frac{\omega a}{A_1 C_2 R_1}}$$

Here, the following terms are incorporated, $$\left. \begin{array}{l} 1 + \frac{Ze}{R_1} = He \\ \sqrt{\frac{\omega a}{A_1 C_2 R_1}} = \omega_0 \\ \sqrt{A_1 C_2 R_1 \omega a} = Q \end{array} \right\} \quad \ldots (7)$$

Substituting the above equations (7) into the equation (6), the gain Gv is $$Gv = \frac{HeS^2}{S^2 + \frac{\omega_0}{Q} S + \omega_0^2} \quad (8)$$

The equation (8) shows that the equalizer circuit functions as a second order high-pass filter having an attenuation characteristic of −12 dB/oct. at the extreme low frequency range.

As is appreciated in the first embodiment of the equalizer circuit according to the invention, it is possible to provide an equalizer circuit with a high D.C. stability without worsening the equalization characteristic, having a low frequency cut-off characteristic of −12 dB/oct.

As understood from the equations (7) and (8), the voltage gain of the equalizer circuit according to the first embodiment falls down to an unity gain in the high frequency range, and deviates from the normal RIAA equalization characteristic. Therefore, a second embodiment of the equalizer circuit according to the invention is proposed hereinunder, in which the voltage gain correctly coincides with the RIAA equalization characteristic even at the high frequency range.

Figure 5:
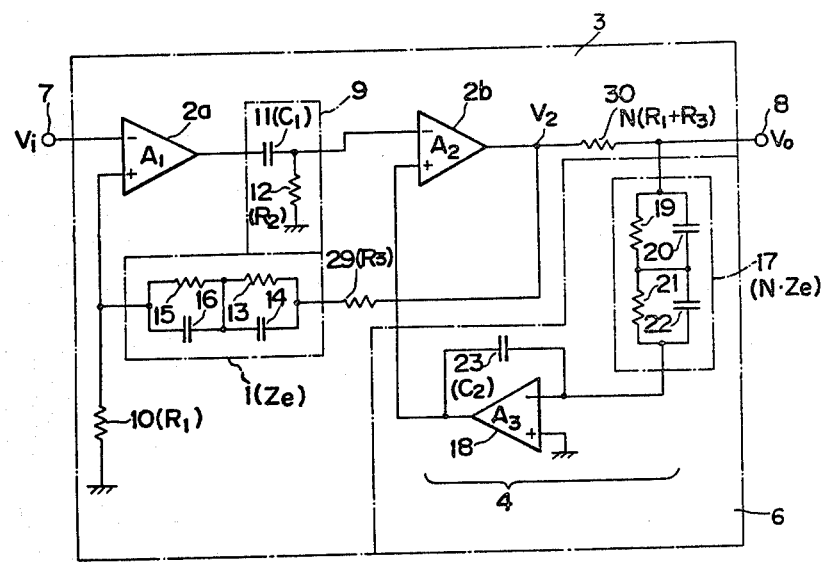
FIG. 5 is a schematic circuit diagram of a second embodiment of an equalizer circuit according to the present invention.

FIG. 5 shows a schematic circuit diagram of a second embodiment of the equalizer circuit according to the invention. The first and second embodiments differ from each other in that a resistor 29 (resistance value $R_3$) is connected between an output terminal of an amplifier 2b and an equalizer element 1 (impedance value Ze), the impedance value of the equalizer element 17 is set N times as large as the impedance Ze, and a resistor 30 {resistance value is N times as large as the value of $(R_1 + R_3)$} is connected between a connection point of the equalizer element 17 and an output terminal 8, and the output terminal of the amplifier 2b.

Figure 6:
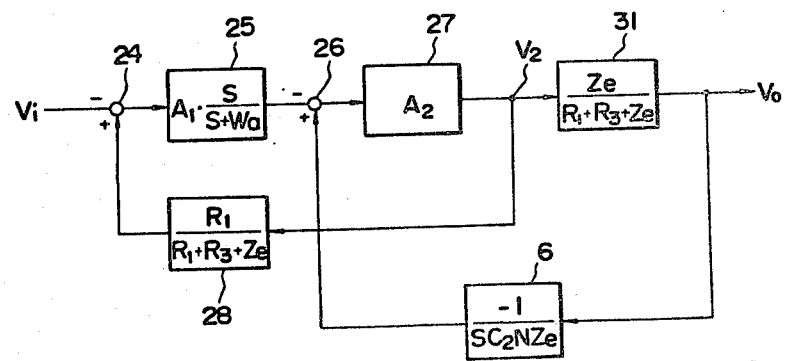
FIG. 6 is a block diagram illustrating an operational principle of the equalizer circuit shown in FIG. 5.

Similarly to the first embodiment, a block diagram shown in FIG. 6 is used for discussing the characteristic of the equalizer circuit according to the second embodiment shown in FIG. 5.

In the block diagram shown in FIG. 6, a block 31 corresponds to a resistor 30 and the equalizer element 17.

Assuming that the voltage appearing at the output terminal of the amplifier 2b is $V_2$, then the voltage $V_2$ is $$v_2 = \frac{R_1 + R_3 + Ze}{Ze} \cdot v_0 \quad (9)$$

The voltage $V_2$ is related to the voltages $V_i$ and $V_0$ in the following equation $$v = \left\{ -\left( v_2 \cdot \frac{R_1}{R_1 + R_3 + Ze} - v_i \right) \cdot A_1 \frac{S}{S + \omega a} - v_0 \frac{1}{SC_2 NZe} \right\} A_2 \quad (10)$$

Substituting the equation (9) into the equation (10), the latter equation (10) is written in the form of $$\left\{ \frac{R_1 + R_3 + Ze}{Ze} + \frac{A_1 A_2 R_1}{Ze} \cdot \frac{S}{S + \omega a} + \frac{A_2}{SC_2 NZe} \right\} v_0 = A_1 A_2 \frac{S}{S + \omega a} v_i \quad (11)$$

Therefore, the voltage gain Gv of the equalizer circuit is $$Gv = \frac{v_0}{v_i} \quad (12)$$

$$= \frac{A_1 A_2 \frac{S}{S + \omega a}}{\frac{R_1 + R_3 + Ze}{Ze} + \frac{A_1 A_2 R_1}{Ze} \cdot \frac{S}{S + \omega a} + \frac{A_2}{SC_2 NZe}}$$

$$= \cfrac{1}{\cfrac{R_1 + R_3 + Z_e}{Z_e} \cdot \cfrac{S + \omega a}{A_1 A_2 S} + \cfrac{R_1}{Z_e} + \cfrac{1}{A_1 C_2 N Z_e} \cdot \cfrac{S + \omega a}{S^2}}$$

Since a condition $A_1 . A_2 \gg 1$ is met, the equation (12) is written as $$G_v = \cfrac{1}{\cfrac{R_1}{Z_e} + \cfrac{1}{A_1 C_2 N Z_e} \cdot \cfrac{S + \omega a}{S^2}} \quad (13)$$

$$= \cfrac{\cfrac{Z_e}{R_1}}{1 + \cfrac{1}{A_1 C_2 N R_1} \cdot \cfrac{S + \omega a}{S^2}}$$

As seen from the equation (13), the voltage gain Gv of the equalizer circuit according to the second embodiment varies, over the low, middle, and high frequency ranges, in accordance with the impedance Ze of the RIAA equalization characteristic, and even over the high frequency range the gain Gv does not deviate from the normal RIAA equalization characteristic. The above equation 13 is further rearranged in the form of $$G_v = \cfrac{\cfrac{Z_e}{R_1} S^2}{S^2 + \cfrac{1}{A_1 C_2 N R_1} \cdot S + \cfrac{\omega a}{A_1 C_2 N R_1}} \quad (14)$$

In the equation (14), the following terms are defined and incorporated therein, $$\left. \begin{array}{l} \cfrac{Z_e}{R_1} = H_e \\[6pt] \sqrt{\cfrac{\omega a}{A_1 C_2 N R_1}} = \omega_0 \\[6pt] \sqrt{A_1 C_2 N R_1 \omega a} = Q \end{array} \right\} \quad \ldots (15)$$

Then the equation (14) is written as $$G_v = \cfrac{H_e S^2}{S^2 + \cfrac{\omega_0}{Q} S + \omega_0^2} \quad (16)$$

As is readily seen from the equation (16), the equalizer circuit of the second embodiment functions as an second order high-pass filter having an attenuation characteristic of $-12$ dB/oct. at the extreme low frequency range.

Figure 7:
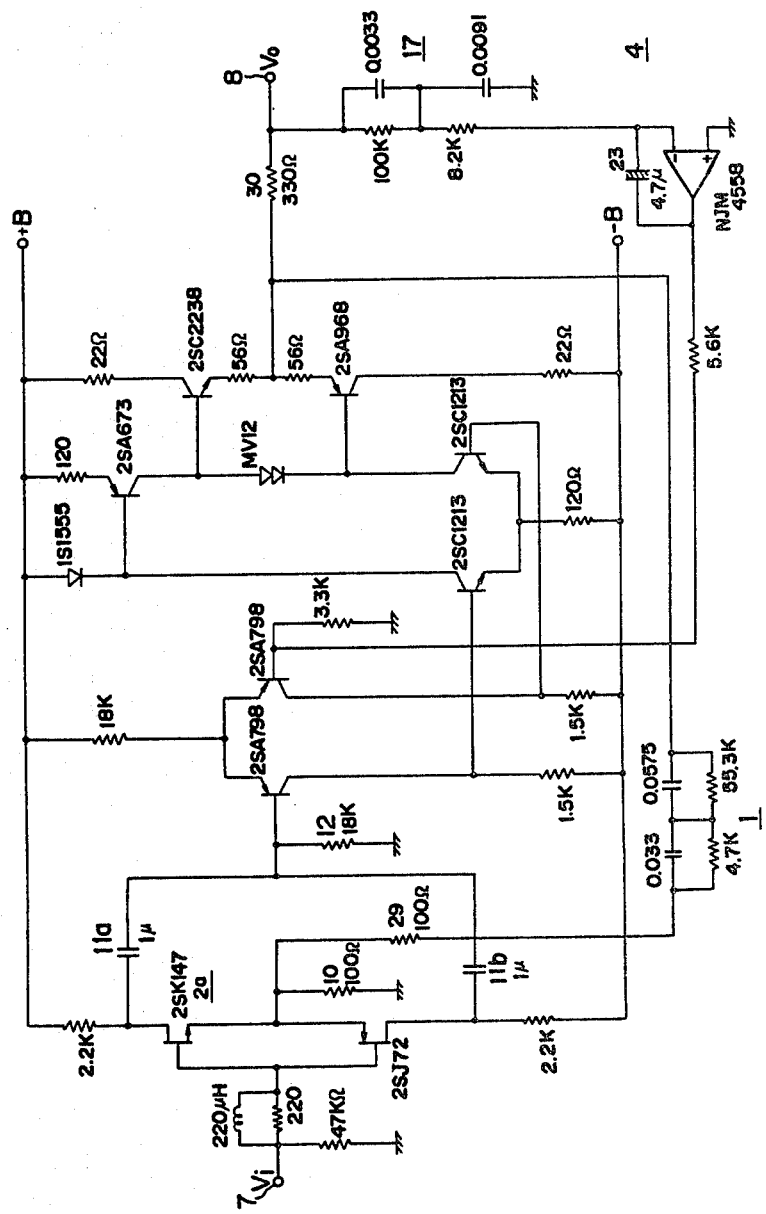
FIG. 7 is a more concrete circuit diagram of the second embodiment of the equalizer circuit.

FIG. 7 is a more concrete circuit diagram of a second embodiment shown in FIG. 5 in which parameters of representative circuit elements are specified, and identical reference numerals have been used to designate corresponding parts of FIG. 5. More specifically in FIG. 7, capacitors 11a and 11b (capacitance value 1μ, respectively) correspond to the capacitor 11 (capacitance value $C_1$) in FIG. 5, a resistor 12 (value 18 kΩ) to the resistor 12 (value $R_2$), a resistor 10 (value 100Ω) to the resistor 10 (value $R_1$), a resistor 29 (value 100Ω) to the resistor 29 (value $R_3$), a resistor 30 (value 330Ω) to the resistor 30 {value $N(R_1+R_3)$}, and equalizer elements 1 and 17 to the equalizer elments 1 and 17 in FIG. 5. In this circuit, the operational amplifier 2b in FIG. 5 is replaced with two differential amplifiers and an output amplifier in a complementary arrangement, and the operational amplifier 2a is replaced with an input amplifier in a complementary arrangement. The operation of the circuit is similar to the second embodiment, and therefore the description thereof is omitted.

Figure 8:
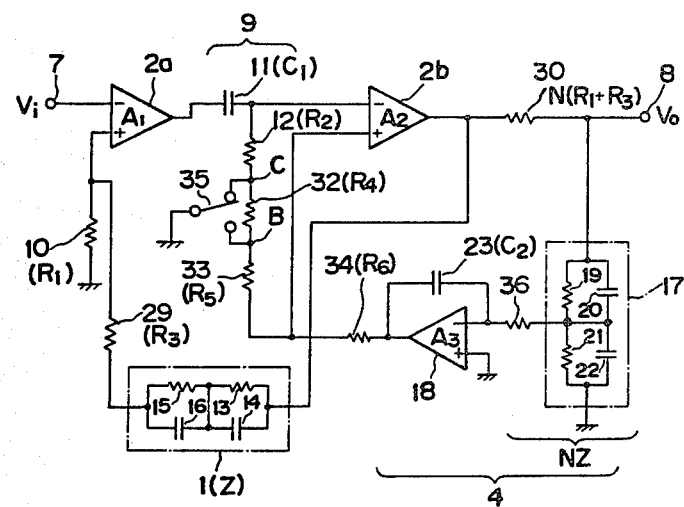
FIG. 8 is a schematic circuit diagram of a third embodiment of the invention which can be used also as a subsonic filter.

As a third embodiment of the invention, an equalizer circuit which can also be used as a subsonic filter is shown schematically in FIG. 8, wherein identical reference numerals have been used to designate corresponding parts of FIG. 5. In the equalizer circuit, a resistor 32 (resistance value $R_4$), resistor 33 (resistance value $R_5$), and resistor 34 (resistance value $R_6$) are serially connected in this order between the resistor 12 and the output terminal of the amplifier 18. The junction point C between the resistors 12 and 32, and the junction point B between the resistors 32 and 33 may selectivelly be grounded by means of a switch 35. The junction point between the resistors 33 and 34 is connected to the non-inverting input terminal of the amplifier 2b. A resistor 36 is connected between the inverting input terminal of the amplifier 18 and the junction point of the resistors 19 and 21 of the equalizer element 17.

Figure 9:
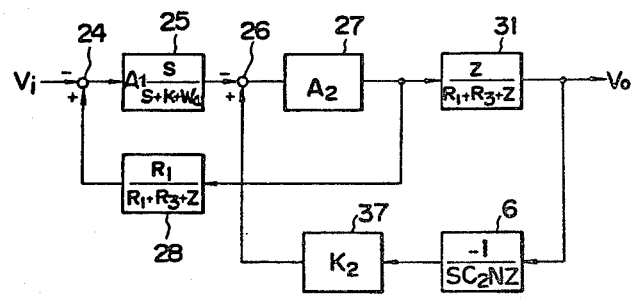
FIG. 9 is a block diagram illustrating an operational principle of the equalizer circuit shown in FIG. 8.

The above equalizer circuit can be represented as a block diagram shown in FIG. 9. In the figure, the value $K_1 . \omega a$ utilized in the block 25 indicates either one of the values $$\cfrac{1}{C_1 R_2} \text{ and } \cfrac{1}{C_1 (R_2 + R_4)}$$

depending upon the state of the switch 35. The value $K_2$ utilized in the block 37 indicates either one of the values $$\cfrac{R_4 + R_5}{R_4 + R_5 R_6} \text{ and } \cfrac{R_5}{R_5 + R_6},$$

both values being an attenuation degree to be obtained between the output terminal of the amplifier 18 and the non-inverting input terminal of the amplifier 2b, depending upon the state of the switch 35.

The operation of the equalizer circuit according to the third embodiment is carried out in a similar manner as described in the second embodiment, however, in this case, the values ω0 and Q utilized in the equation (15) vary due to the operation of the switch 35 as in the following equations $$\omega_0 = \sqrt{\cfrac{\omega a K_1 K_2}{A_1 C_2 N R_1}} \quad (17)$$

$$Q = \sqrt{\cfrac{A_1 C_2 N R_1 \omega a K_1}{K_2}}$$

Figure 10:
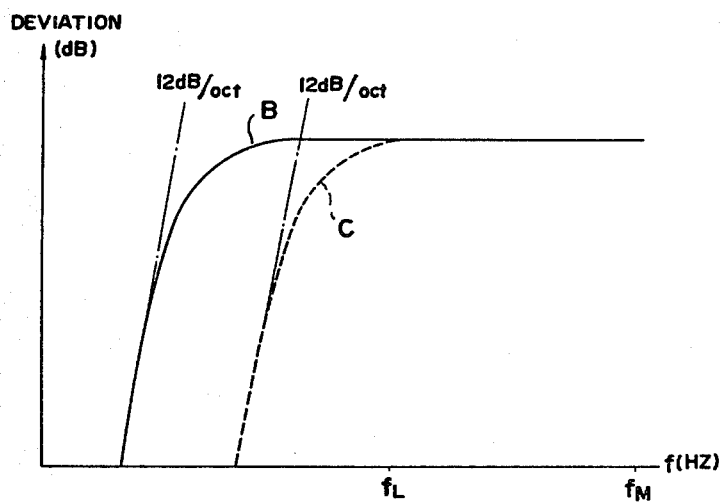
FIG. 10 is a graph showing a deviation of characteristic of the equalizer circuit shown in FIG. 8.

As is readily seen from the equation (17), if each of the resistance values $R_4$, $R_5$ and $R_6$ is determined so as to meet a condition of $K_1 = \alpha K_2$ (α:const), the value $\omega_0$ can be varied in proportion to the value $\sqrt{K_1 . K_2} = \sqrt{\alpha . K_1}$ with the value Q maintained constant. For more specified illustration of the equlizer circuit, a frequency characteristic over the low frequency range is shown in FIG. 10, in which the resistance value $R_2$, $R_4$, $R_5$ and $R_6$ are determined such that the value $\alpha$ is maintained constant, and in which as the values $K_1$ and $K_2$ change between the initial values $K_{11}$ and $K_{21}$ and three-times $K_{11}'=3K_{11}$ and $K_{21}'=3K_{21}$ thereof, respectively, then the value $\omega 0$ changes also between the initial value $\omega_{01}$ and three-times value $\omega_{01}'=3\omega_{01}$ thereof, upon changeover of the switch 35. In FIG. 10, a solid line B indicates a deviation of the voltage gain of the equalizer circuit from the ideal RIAA equalization characteristic when the circuit is used by grounding the junction point B upon actuation of the switch 35 (i.e., the subsonic filter is turned off), and a dotted line C indicates a deviation of the voltage gain from the ideal RIAA equalization characteristic when the circuit is used by grounding the junction point C upon actuation of the switch 35 (i.e., the subsonic filter is turned on).

As appreciated from the above description of the third embodiment, it is possible to improve the D.C. stability of the equalizer circuit without adversely affecting the equalization characteristic, and also possible to afford a subsonic filter function to the equalizer circuit in an extremely simple way.

While there has been shown and described specific embodiments of the present invention, it will be obvious to those skilled in the art that various changes and modification may be made without departing from the invention in its broader aspects and, therefore, it is intended that the appended claims cover all such changes and modifications as fall within the true spirit and scope of the invention.

What is claimed is:

1. An equalizer circuit comprising:
   an input signal terminal for receiving an input signal;
   amplifying means coupled to said input signal terminal for amplifying in accordance with a RIAA equalization characteristic said input signal applied to said input signal terminal;
   an output signal terminal for outputting said amplified input signal;
   first equalizer element means connected at its one end to said output signal terminal and having an impedance corresponding to an inverse RIAA equalization characteristic;
   direct current component detecting means connected to the other end of said first equalizer element means for deriving a direct current component from the output appearing at said other end;
   negative feedback circuit means for negatively feeding back said derived direct current component to said amplifying means as a negative feedback signal thereof;
   said amplifying means having a non-inverting input terminal coupled to said input signal terminal, an inverting input terminal coupled to ground, and an output terminal coupled to said output signal terminal;
   second equalizer element means coupled between said output and inverting input terminals of said amplifying means and having an impedance corresponding to an inverse RIAA equalization characteristic; and
   first resistor means coupled in series with said second equalizer element means between said output terminal of said amplifying means and grounds.

2. An equalizer circuit according to claim 1, further comprising:
   second resistor means coupled between said output terminal of said amplifying means and said output signal terminal.

3. An equalizer circuit according to claim 1 or 2, in which said amplifying means comprises:
   a first amplifier having an inverting input terminal coupled to said input signal terminal, a non-inverting input terminal coupled to ground through said first resistor means, and an output terminal;
   a second amplifier having an inverting input terminal coupled to said output terminal of said first amplifier, a non-inverting input terminal and an output terminal coupled to said output signal terminal; and
   said second equalizer element means being coupled between said output terminal of said second amplifier and the non-inverting input terminal of said first amplifier,
   wherein said negative feedback signal is negative-fed back to the non-inverting input terminal of said second amplifier.

4. An equalizer circuit according to claim 3, further comprising impedance circuit means coupled between the output terminal of said first amplifier and the inverting input terminal of said second amplifier.

5. An equalizer circuit according to claim 4, in which said impedance circuit means comprises: first capacitor means connected between the output terminal of said first amplifier and the inverting input terminal of said second amplifier; and third resistor means connected between the inverting input terminal of said second amplifier and ground.

6. An equalizer circuit according to claim 5, in which said direct current component detecting means is a Miller integration circuit comprising:
   a third amplifier having a non-inverting input terminal coupled to ground, an inverting input terminal coupled to said other end of said first equalizer element means, and an output terminal coupled to the non-inverting input terminal of said second amplifier; and
   second capacitor means coupled between the inverting and output terminals of said third amplifier.

7. An equalizer circuit according to claim 2, wherein said first resistor means has a resistance value of R, said second resistor means has a resistance value of N times as large as the value R, and said first equalizer element means has an impedance value of N times as large as an impedance value Ze which is the impedance corresponding to an inversed RIAA equalization characteristic.

8. An equalizer circuit according to claim 6, further comprising:
   fourth resistor means coupled between the output terminal of said amplifying means and the non-inverting input terminal of said first amplifier;
   wherein said fourth resistor means has a resistance value of $R_3$, said second resistor means has a resistance value of N times as large as a sum of $(R_1+R_3)$, where $R_1$ is a resistance value of said first resistor means, and said first equalizer element means has an impedance value of N times as large as an impedance value Ze which is the impedance corresponding to an inversed RIAA equalization characteristic.

9. An equalizer circuit according to claim 6, in which said third resistor means of the impedance circuit means comprises first, second, and third resistors serially connected in this order between the inverting and non-inverting input terminals of said second amplifier;

fifth resistor means is further coupled between the output terminal of said third amplifier and the non-inverting input terminal of said second amplifier; and further comprising switch means for selectively connecting one of the opposite ends said second resistor to ground.

10. An equalizer circuit according to claim 6, in which each of said first and second equalizer element means comprises a pair of parallel connected sixth resistor means and third capacitor means, and a pair of parellel connected seventh resistor means and fourth capacitor means, both pairs being connected serially to each other.

* * * * *